(12) United States Patent
Pierschel et al.

(10) Patent No.: US 8,796,802 B2
(45) Date of Patent: Aug. 5, 2014

(54) SEMICONDUCTOR PHOTODETECTOR AND RADIATION DETECTOR SYSTEM

(75) Inventors: Michael Pierschel, Berlin (DE); Frank Kudella, Berlin (DE)

(73) Assignee: First Sensor AG, Berlin (DE)

( * ) Notice: Subject to any disclaimer, the term of this patent is extended or adjusted under 35 U.S.C. 154(b) by 132 days.

(21) Appl. No.: 13/501,939

(22) PCT Filed: Oct. 13, 2010

(86) PCT No.: PCT/DE2010/075108
§ 371 (c)(1),
(2), (4) Date: Jun. 22, 2012

(87) PCT Pub. No.: WO2011/044896
PCT Pub. Date: Apr. 21, 2011

(65) Prior Publication Data
US 2012/0248562 A1    Oct. 4, 2012

(30) Foreign Application Priority Data

Oct. 16, 2009 (DE) .......................... 10 2009 049 793

(51) Int. Cl.
*H01L 31/107* (2006.01)

(52) U.S. Cl.
USPC ........... 257/438; 257/432; 257/408; 257/371; 257/629; 257/630; 257/652; 257/386; 257/E31.063; 257/E21.433; 257/E21.633; 438/290; 438/91; 438/460; 438/138; 438/627

(58) Field of Classification Search
CPC .............. H01L 21/823807; H01L 21/823878; H01L 31/107
USPC .................. 257/E31.063, E31.127, 432, 438, 257/E21.433, E29.266, E21.633, 408, 371, 257/629, 630, 652, 386; 438/91, 290
See application file for complete search history.

(56) References Cited

U.S. PATENT DOCUMENTS

2011/0095388 A1 *  4/2011  Richter et al. ................ 257/432

FOREIGN PATENT DOCUMENTS

| DE | 102007037020 B3 * | 8/2008 |
| JP | 59114875 A | 7/1984 |
| JP | 2301162 A | 12/1990 |
| JP | 2006080427 A | 3/2006 |
| WO | 2008/011617 A2 | 1/2008 |

OTHER PUBLICATIONS

PCT International Preliminary Report on Patentability for PCT Application No. PCT/DE2010/075108 mailed May 18, 2012 (12 pages).
Aull et al., "Geiger-Mode Avalanche Photodiodes for Three-Dimensional Imaging," 2002, 335-348, 13(2), Lincoln Laboratory Journal.
Grove, "Physics and Technology Semiconductor Devices," 1967, John Wiley & Sons (Preface).

(Continued)

*Primary Examiner* — Jerome Jackson, Jr.
*Assistant Examiner* — Bo Fan
(74) *Attorney, Agent, or Firm* — Sutherland Asbill & Brennan LLP (57) ABSTRACT

Semiconductor photodetectors are provided that may enable optimized usage of an active detector array. The semiconductor photodetectors may have a structure that can be produced and/or configured as simply as possible. A radiation detector system is also provided.

12 Claims, 8 Drawing Sheets

(56) References Cited

OTHER PUBLICATIONS

Sadygov et al., "Three Advanced Designs of Micro-Pixel Avalanche Photodiodes: Their Present Status, Maximum Possibilities and Limitations," 2006, 70-73, A 567, Nuclear Instruments and Methods in Physics Research.

Sadygov et al., "The Investigation of Possibility to Create the Multichannel Photodetector Based on the Avalanche MRS-Structure," 1991, 158-168, SPIE vol. 1621, The International Society for Optical Engineering.

Sze, "Semiconductor Devices Physics and Technology," 1985, John Wiley & Sons (Preface).

PCT International Search Report for PCT/DE2010/075108 mailed Sep. 2, 2011 (8 pages).

* cited by examiner

Prior art

SEMICONDUCTOR PHOTODETECTOR AND RADIATION DETECTOR SYSTEM

CROSS-REFERENCE TO RELATED APPLICATIONS

This is a submission pursuant to 35 U.S.C. 154(d)(4) to enter the national stage under 35 U.S.C. 371 for PCT/DE2010/075108, filed Oct. 13, 2010. Priority is claimed under 35 U.S.C. 119(a) and 35 U.S.C. 365(b) to German. Patent Application Number 1.0 2009 049 793.5, filed Oct. 16, 2009. The subject matters of PCT/DE2010/075108 and German Patent Application Number 10 2009 049 793.5 are expressly incorporated herein by reference.

FIELD OF THE INVENTION

The invention relates to technologies in the field of semiconductor photodetectors.

BACKGROUND OF THE INVENTION

Semiconductor photodetectors that use the "avalanche effect" for signal amplification have areas of high electrical field strength in a near-surface region of the semiconductor substrate, and these areas help to multiply charge carriers that are generated by radiation absorption in the semiconductor substrate. The areas of high electrical field strength are created for example by forming doping zones that have been doped according to different doping types and are assigned to each other within the semiconductor substrate of the photodetector.

In order to detect extremely small quantities of radiation, down to the level of single photons, such semiconductor photodetectors are operated with a bias voltage higher than the voltage that causes permanent breakdown of the component structures. When the semiconductor photodetector is operated, after a certain time thermally generated charge carriers or charge carriers generated by radiation absorption penetrate the area of high electrical field strength and are multiplied there by "avalanche breakdown", which causes a high current between the electrical connectors or contacts of the semiconductor photodetector. If the voltage at the electrical contacts of the photodetector is not lowered and if internal serial resistances within the semiconductor photodetector do not bring about a reduction in the high field strength, the breakdown becomes permanent, since new charge carriers are created constantly in the resulting charge carrier avalanche.

However, if a serial resistance is interposed between the operating voltage and the contacts of the semiconductor photodetector, the field strength in the area of high electrical field strength may be reduced by the current pulse and the associated voltage drop in such manner that permanent avalanche multiplication can no longer be sustained. Consequently, the current falls and the high field strength in the area of high field strength is established again. Such a serial resistance is also referred to as a quench resistance.

All of the processes described are time-dependent. For semiconductor photodetectors with a relatively large detector array, switching times or recovery times between the triggering of a charge carrier avalanche and quenching of the avalanche, that is to say the time before a single incident can be registered again, is very long. It was therefore suggested to divide the active surface of the semiconductor photodetector in a large number of individual pixel elements and to assign a quench resistance to each pixel element (see for example Sadygov Z.: "Three advanced designs of micro-pixel avalanche photodiodes: Their present status, maximum possibilities and limitations", Nuclear Instruments and Methods in Physics Research A 567 (2006)70-73). In a structural variant of known avalanche photodiodes, the quench resistance is partially in the area of the radiation penetration window. This causes disadvantages with regard to the usable detector area, since this is limited by resistance layers and metal contacts.

It was suggested in document DE 10 2007 037 020 B3 to form the quench resistance in the semiconductor substrate of the photodetector, between the area of high field strength and a contact layer on the back side. The quench resistance is thus located deep inside the semiconductor substrate. However, this construction has the disadvantage that highly specific requirements are imposed on the design of the semiconductor substrate, and particular dependence on material parameters and structure sizes of the pixel elements arises.

Document DE 10 2007 037 020 B3 discloses an avalanche photodiode for detecting radiation.

A single photon avalanche photodiode is described in the document WO 2008/011617.

BRIEF SUMMARY

The object of the invention is to describe new technologies for semiconductor photodetectors that enable both optimised usage of the active detector array and a photodetector structure that may be produced and configured as simply as possible. In particular, it aims to reduce the dependency of the semiconductor photodetector on special material parameters and structure properties.

This object is solved according to the invention by a semiconductor photodetector as described in independent claim 1 and a radiation detector system as described in independent claim 11. Advantageous variations of the invention constitute the object of the dependent subordinate claims.

BRIEF DESCRIPTION OF THE FIGURES

In the following, the invention will be explained in greater detail on the basis of preferred embodiments thereof and with reference to the figures. The figures show.

DETAILED DESCRIPTION

The invention encompasses the idea of a semiconductor photodetector comprising:
- a semiconductor substrate,
- an upper doping zone, which is doped according to a first doping type and extends laterally on an upper side in the semiconductor substrate,
- a lower doping zone, which is doped according to a second doping type and is assigned to the upper doping zone so as to form avalanche areas in such manner that the lower doping zone extends laterally in the semiconductor substrate and facing the upper diode doping zone, and is constructed discontinuously by the formation of at least one intermediate area,
- a quench resistance area, which is formed in the semiconductor substrate between the lower doping zone and a contact layer that is formed on the back of the semiconductor substrate,
- a first additional doping zone, which is doped according to the first doping type, located in an area in the semiconductor substrate between the lower doping zone and the contact layer and extends laterally below the at least one intermediate area and into the area below the lower doping zone, and is discontinuous below the lower doping zone, and
- a second additional doping zone, which is doped according to the second doping type, located in the area between the lower doping zone and the first additional doping zone in the semiconductor substrate, extends laterally below the at least one intermediate area and forms a potential barrier between the upper doping zone and the first additional doping zone.

The invention further provides a radiation detector system having the following features: a semiconductor photodetector of the aforementioned type in which at least one contact connection assigned to the first additional doping zone is formed, and a control circuit that is coupled to the at least one contact connection and configured to provide a control signal for a control potential that is to be applied to the first additional doping zone.

According to the invention, a first and a second doping zone, each doped according to different doping types, are provided below the avalanche areas in the semiconductor photodetector. The first additional doping zone is preferably never impoverished with regard to charge carriers and is located lower in the semiconductor substrate, which substrate itself is doped according to the second doping type. In this way, the first additional doping zone may be used to in this respect as a subgate electrode, so that the first additional doping zone may also be referred to as a subgate doping zone.

The second additional doping zone serves to form a potential barrier between the upper doping zone of the avalanche area and the first additional doping zone. This decoupling makes it possible for the quench resistance to be adjusted independently and individually by applying a corresponding control potential to the first additional doping zone (subgate doping zone).

In quite general terms, the avalanche areas and the non-active areas located between them together form a contiguous detector array of the semiconductor photodetector. To this extent, the avalanche areas form "pixel elements" of the detector array. One or more lower doping zones may be assigned to such a pixel element. The first additional doping zones located below the detector array form a network of "subgate electrodes".

The structural configuration of the semiconductor photodetector with the additional doping zones renders operation of the detector more independent of production-related material and structural constraints such as layer thickness, doping concentrations, layout tolerances or other parameter variations. Even fluctuating temperature effects may be compensated in this way. Different potentials may be applied to the upper doping zone of the avalanche area and the first additional doping zone, although both doping zones are doped according to the same doping type. This makes it possible to set the avalanche operating point and the quench resistance necessary to quench the charge avalanche separately.

With the invention it becomes possible to drive even relatively small detector structures appropriately for their function, so that the yield of functioning detector structures on wafer is increased. Large and very expansive functioning structures are only even possible because of this. By making larger area components usable, it becomes possible to integrate arrays with an upper doping zone having an intermittent design.

A preferred embodiment of the invention provides that the second additional doping zone extends laterally at least over the entire width of the at least one intermediate area. When the semiconductor photodetector is viewed from above, the second additional doping zone in this embodiment extends over the entire surface of the at least one intermediate area, which is formed in the lateral direction between the sections of the lower doping zone. At the same time, the second additional doping zone may optionally extend into the area below the lower doping zone. Such a design of the second additional doping zones may be created using masked doping zone production methods.

In an advantageous embodiment of the invention, it may be provided that the second additional doping zone has the form of a continuous doping zone that is impoverished in the at least one intermediate area. In this variation, it is possible to produce the continuous doping for the first additional doping zone in a maskless production process. Accordingly, the use of masks during doping may be dispensed with.

An advantageous embodiment of the invention provides a contact connection for the first additional doping zone, via which a control circuit may be connected to the first additional doping zone. In a refinement thereof, a plurality of such contact connections are formed, each being assigned to one or more first additional doping zones. Through the optional connection of the control circuit to the one or more contact connections, which are assigned to the one or more first doping zone, a control potential may be applied to the first additional doping zone, which is formed lower in the semiconductor substrate than the second additional doping zone, and in accordance with the preceding notes may also be referred to as a subgate doping zone. If multiple contact connections are provided, these may be charged with different potentials. In this way, in a variation it also becomes possible for different potentials for different potentials to be applied to multiple first additional doping zones that are assigned to a common pixel element. In an advantageous design, multiple separate contact connections are produced for the first additional doping zones at the edge of the detector array conned by the array of pixel elements, that is to say still inside and/or already outside the detector array. However, contact connections may also be provided solely or additionally in areas of the detector array away from the edges thereof. In this way, it is possible to correct systematic errors during operation in any direction over the detector array by applying potentials that compensate for the errors to contact connections that are assigned to each other. The assignment between contact connections by charging with corresponding potential may be carried out for example for adjacent and/or opposing contact connections. In this way, it becomes possible to correct systematic errors for any desired section or region of the detector array. At the same time, it may be provided that multiple sides of the pixel element array, for example opposite sides, are formed with separate contact connections that are assigned to the first additional doping zones. It thus becomes possible to control the first additional doping zone(s) independently due to the potential barrier formed by the second additional doping zone between the upper doping zone, which is assigned to the avalanche area, and the first additional doping zone. In this respect, the invention also relates to a method for operating the semiconductor photodetector, in which potentials for correcting systematic errors are applied to contact connections that are assigned to the first additional doping zones.

A preferred embodiment of the invention provides that the contact connection is formed with an external contact and overlapping conductive doping zones, which are doped in accordance with the first doping type. The overlapping conductive doping zones are preferably created for example with the aid of a mesa structure or V-groove etching with subsequent doping of the surface. But the use of technologies in conjunction with areas of suitable width that have been filled in with doped polysilicon may also be provided. In this context, it is sufficient to provide only one contact connection for the first additional doping zone, since this extends in a plane in the semiconductor substrate, although it is also discontinuous opposite the avalanche areas.

In an advantageous embodiment of the invention, it may be provided that the contact connection is formed outside a detector array. The contact connection is preferably formed on the edge of the detector array, that is to say adjacent to the surface belonging to the avalanche areas that define the pixel elements and the areas formed between them.

A preferred embodiment of the invention provides a contact connection assigned to the lower doping zone, via which a control circuit may be connected to the lower doping zone. In a refinement thereof, a plurality of such additional contact connections is formed, each of which is assigned to one or more lower doping zones. The control circuit that may be coupled to the additional contact connection is preferably designed such that it is able to measure the quench resistance for the quench resistance area. If the control circuit designed in this way is combined with the circuit for applying the control potential to the first additional doping zone via the contact connection, a means for adjusting the control potential is created in such manner that it may be set and adjusted depending on the measured quench resistance.

A preferred embodiment of the invention provides that the additional contact connection is formed with a further external contact and a doping zone that is doped in accordance with the second doping type. The explanatory notes provided with regard to the associated design of the contact connection apply correspondingly.

In an advantageous embodiment of the invention, it may be provided that the additional contact connection is formed in a discontinuous area of the upper doping zone inside the detector array.

An advantageous embodiment of the invention provides that additional contact connection is arranged essentially centrally relative to an assigned quench resistance area.

With respect to the radiation detector system, in an advantageous embodiment of the invention it may be provided that an additional contact connection is still formed on the semiconductor photodetector and assigned to the lower doping zone and the control circuit is coupled and still configured on the additional contact connection to capture a measured value for the quench resistance of the semiconductor photodetector, and to provide a control signal derived therefrom for the control potential that is to be applied to the first additional doping zone. Multiple control circuits and/or a control circuit have multiple resistance measurement and adjustment structures may be provided.

Figure 1:
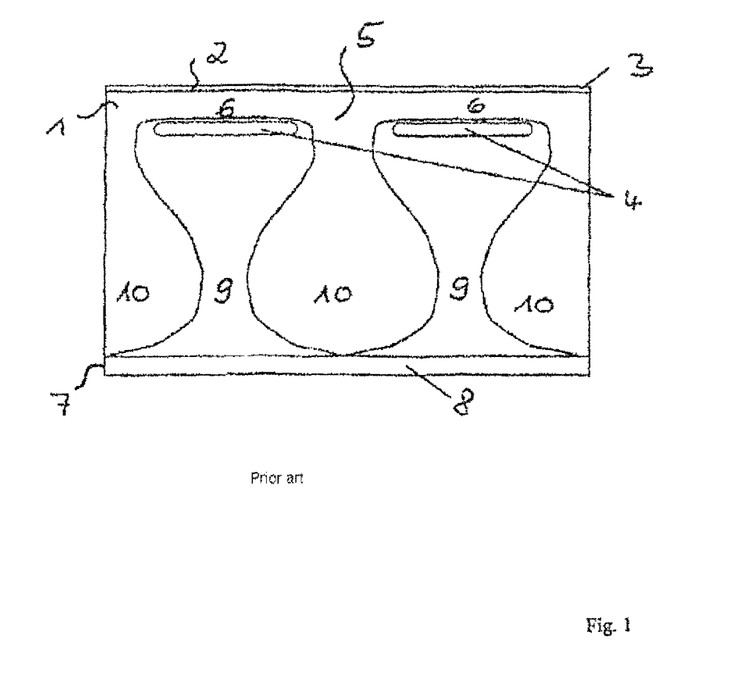
FIG. 1 a schematic view of a cross-section through a portion of a known se conductor photoconductor, FIG. 2 a schematic view of a cross-section through a portion of a semiconductor photoconductor with additional doping zones, FIG. 3 a schematic view of a cross-section through a portion of a known semiconductor photoconductor with additional doping zones, wherein a second additional doping zone is formed discontinuously, FIG. 4 a schematic view of a portion of the semiconductor photoconductor of FIG. 3, wherein a contact connection is formed for one of the additional doping zones, FIG. 5 a schematic view of a cross-section through a portion of a semiconductor photoconductor with additional doping zones, wherein the contact connection for the additional doping zone of FIG. 4 is realised according to modified design, FIG. 6 a schematic view of a cross-section through a portion of a semiconductor photoconductor with additional doping zones, wherein a further contact connection is realised for a lower doping zone of the avalanche area, FIG. 7 a schematic view of a cross-section through a portion of a semiconductor photoconductor in which a control circuit is coupled between a lower doping zone of the avalanche area and an additional doping zone, and FIG. 8 a schematic view of a portion of a detector service of a semiconductor photodetector.

FIG. 1 shows a schematic view of a cross-section through a portion of a known semiconductor photoconductor. An upper doping zone 3 is formed extending laterally and continuously on an upper side 2 in a substrate 1 made from a semiconductor material. Upper doping zone 3 is doped according to a first doping type, which may be either a p-doping or an n-doping type. Without limitation to the general premise, it will be assumed in the following that the doping in the exemplary embodiment represented is of the p-doping type. A lower doping zone 4 is formed facing upper doping zone 3, which lower doping zone extends laterally and is constructed discontinuously in intermediate areas 5. Lower doping zone 4 is doped according to a second doping type that differs from the first doping type. In the chosen embodiment, this means that lower zone 4 is provided with n-doping.

An area of high field strength 6 is formed between upper doping zone 3 and lower doping zone 4, which area causes the avalanche effect in the semiconductor photodetector during radiation detection and may therefore also be referred to as the avalanche area. Avalanche like multiplication takes place in area of high field strength 6 after the creation of charge carriers due to radiation absorption, particularly of single photons.

A contacting layer 8 is produced on a rear side 7 of substrate 1 by n-doping. During production of a semiconductor photodetector, rear contacting layer 8 may be arranged on a carrier substrate (not shown) directly or indirectly over one or more layers. In the known semiconductor photodetector as shown in FIG. 1, a quench resistance area 9 extends between lower doping zone 4 and contacting layer 8, this quench resistance area being an area of substrate 1 that is unimpoverished in terms charge carriers, and the substrate in turn is doped according to the second doping type, corresponding in the chosen embodiment to n-doping. Areas of an impoverishment zone 10 are formed between the quench resistance areas 9. These form isolating area between quench resistance areas 9. Quench resistance areas 9 and impoverishment zones 10 are formed when a working voltage is applied during operation of the semiconductor photodetector in such manner that quench resistance areas 9 are still electrically conductive in the working point, whereas the resistance in impoverishment zones 10 is in the order of giga-ohms. Together with lower doping zones 4, this gives rise to a spatial structure that is mushroom-shaped or cylindrically symmetrical.

In the following, exemplary embodiments of the invention will be explained in greater detail with reference to FIGS. 2 to 7. Features that are identical to those in FIG. 1 will be identified using the same reference numbers in FIGS. 2 to 8.

Figure 2:
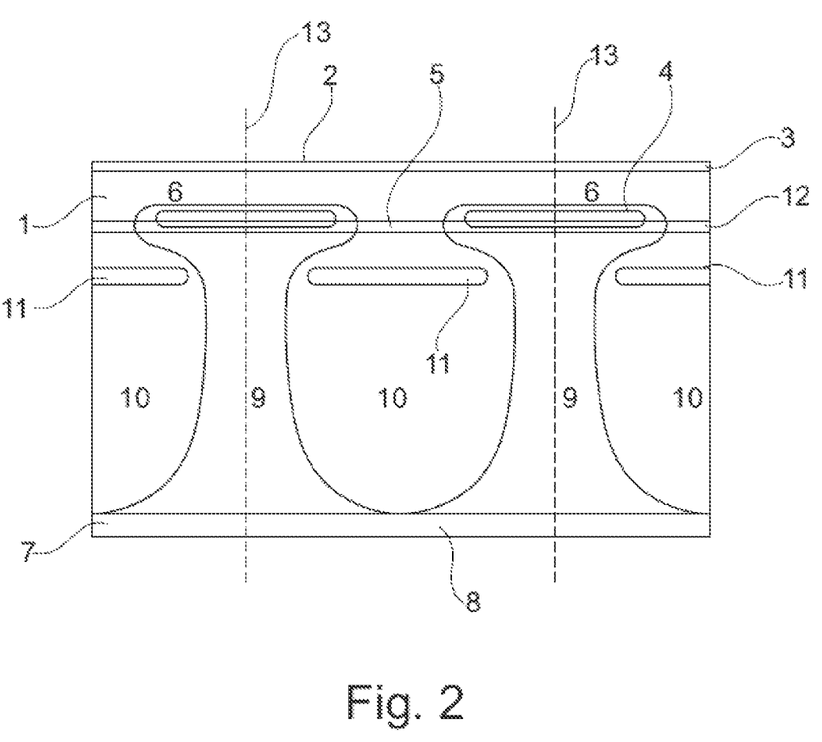

FIG. 2 shows a schematic view of a cross-section through a portion of a semiconductor photoconductor that has additional doping zones in substrate 1 compared with the known detector of FIG. 1. Initially, a first additional doping zone 11 is provided, which is doped according to the first doping type, corresponding to p-doping in the embodiment chosen here. First additional doping zone 11 is arranged to extend laterally in substrate 1 in the area between lower doping zone 4 and contacting layer 8. First additional doping zone 11 is also discontinuous in an area below lower doping zone 4. Impoverishment zone 10 extends in this area. In the lateral direction, the portions of first additional doping zone 11 include at least the area of intermediate area 5 and extend to below lower doping zone 4.

According to FIG. 2, a second additional doping zone 12 is also provided, and this is doped according to the second doping type, corresponding in the chosen embodiment to n-doping. Second additional doping zone 12 is formed in an area in substrate 1 that includes lower doping zone 4 and first additional doping zone 11 as well at the region between these two zones. In the embodiment shown in FIG. 2, second additional doping zone 12 is produced so as to overlap with lower doping zone 4. Alternatively, (not shown), it may be provided that second additional doping zone 12 is arranged deeper in substrate 1, for example adjacent to or even overlapping with first additional doping zone 11. The representation in FIG. 2 shows that second additional doping zone 12 is not limited laterally, but rather extends continuously.

Second additional doping zone 12 impoverishes intermediate area 5 located between avalanche areas 6 entirely in terms of charge carriers, thereby guaranteeing the separation of avalanche area 6 and to this extent a separation of pixel elements in the semiconductor photodetector's detector array. At the same time, second additional doping zone 12 forms a potential barrier between upper doping zone 3 and first additional doping zone 11, so that these two doping zones may be connected to different electrical potentials. This enables the avalanche breakdown in the area of high electrical field strength 6 to be controlled regardless of the setting of the quench resistance in quench resistance area 9.

In FIG. 2, dashed line 13 indicates the centre of avalanche area 6, that is to say the centre of an associated pixel element. With regard to their two-dimensional shape, these areas may be circular or hexagonal for example.

Figure 3:
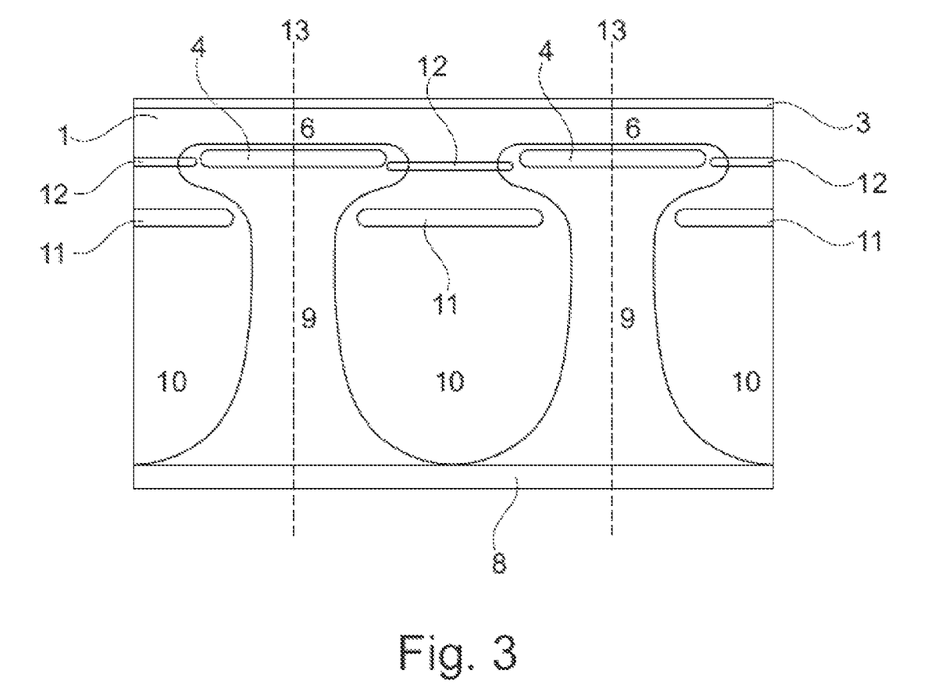

FIG. 3 shows a schematic view of a cross-section through a portion of a semiconductor photoconductor that, like the detector in FIG. 2, has a first and a second additional doping zone 11, 12, but unlike the embodiment of FIG. 2 second additional doping zone 12 is limited laterally in such manner that it only extends in intermediate area 5 and does not laterally include the area of lower doping zone 4. In this variation also, second additional doping zone 12 impoverishes intermediate area 5 and forms the potential barrier between upper doping zone 3 and first additional doping zone 11.

Figure 4:
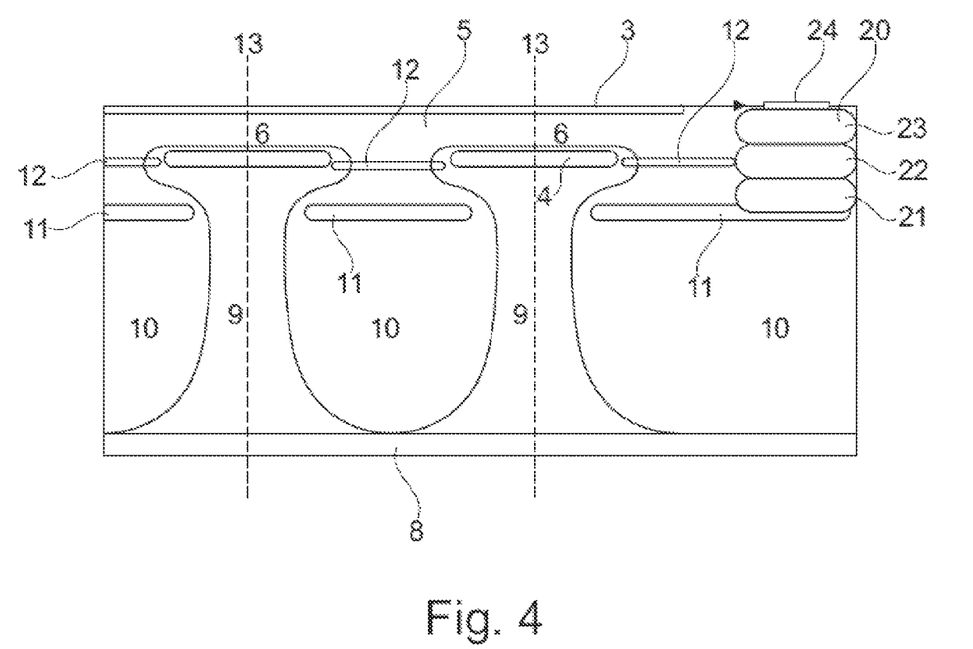

FIG. 4 shows a schematic view cross section of a semiconductor photoconductor in which first additional doping zone 11 is connected to a contact connection 20 that in the embodiment shown is formed with doping zones 21, . . . , 23 that overlap one another in conducting manner, and with an external contact 24. In this way, an electrical connection is enabled with first additional doping zone 11, to enable a control potential to be applied, for example. The doping zones 21, . . . , 23 that overlap in conducting manner are doped according to the first doping type, corresponding in the chosen embodiment to p-doping. Connecting contact 20 is electrically isolated from upper doping zone 3 and in the embodiment shown is located outside the active detector array, which is formed by the pixel elements assigned to avalanche areas 6 and the non-active intermediate areas 5 located between them.

In general, a single contact connection 20 is sufficient to connect first additional doping zone 11, since first additional doping zone 11 extends in a laterally contiguous plane and recesses are formed below avalanche areas 6. Since upper doping zone 3 and first additional doping zone 11 are separated or decoupled by the potential barrier provided by second additional doping zone 12, a different potential than the one applied to upper doping zone 3 may be applied to first additional doping zone 11 via contact connection 20. In this way, they may be controlled independently of one another.

Figure 5:
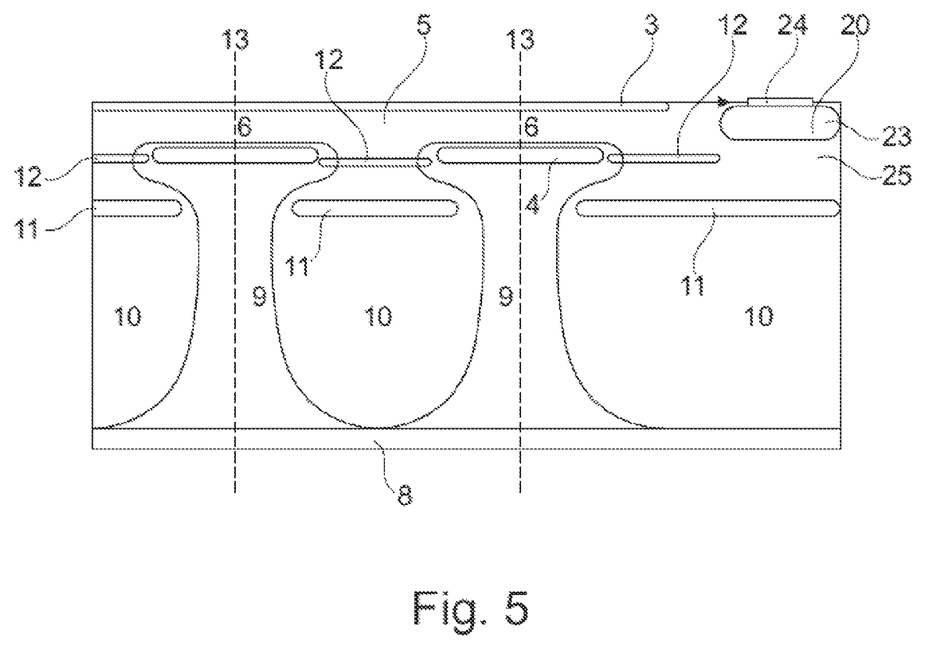

FIG. 5 shows a schematic view of a cross-section through a portion of a semiconductor photoconductor, wherein contact connection 20 for the first additional doping zone 11 of FIG. 4 is realised according to modified design. Compared with the embodiment of FIG. 4, two of the conductively overlapping doping zones 21, 22 are omitted. However, the potential of first additional doping zone 11 may still be controlled via contact connection 20. Since no direct potential barrier is created in semiconductor area 25 between doping zone 23 and the assigned first additional doping zone 11, increasing the potential at external contact 24 causes charge carriers to flow from the assigned first additional doping zone 11, through semiconductor area 25, and into doping zone 23, where the potential of the assigned first additional doping zone 11 is also raised very rapidly. The reverse process of reducing the potential takes place very slowly, since in this case a two-dimensional potential barrier is formed between doping zone 23 and first additional doping zone 11, strongly inhibiting the direct exchange of charge carriers. The potential of first additional doping zone 11 thus initially remains at a preset value and is changed to the space charge depth solely by charge carriers generated by light or darkness that flow into the region surrounding first additional doping zone 11 until the two-dimensional potential barrier has been eliminated. Any charge carriers that flow into this region subsequently are dissipated towards doping zone 23. After this point the value of the potential of first additional doping zone 11 remains essentially unchanged.

Figure 6:
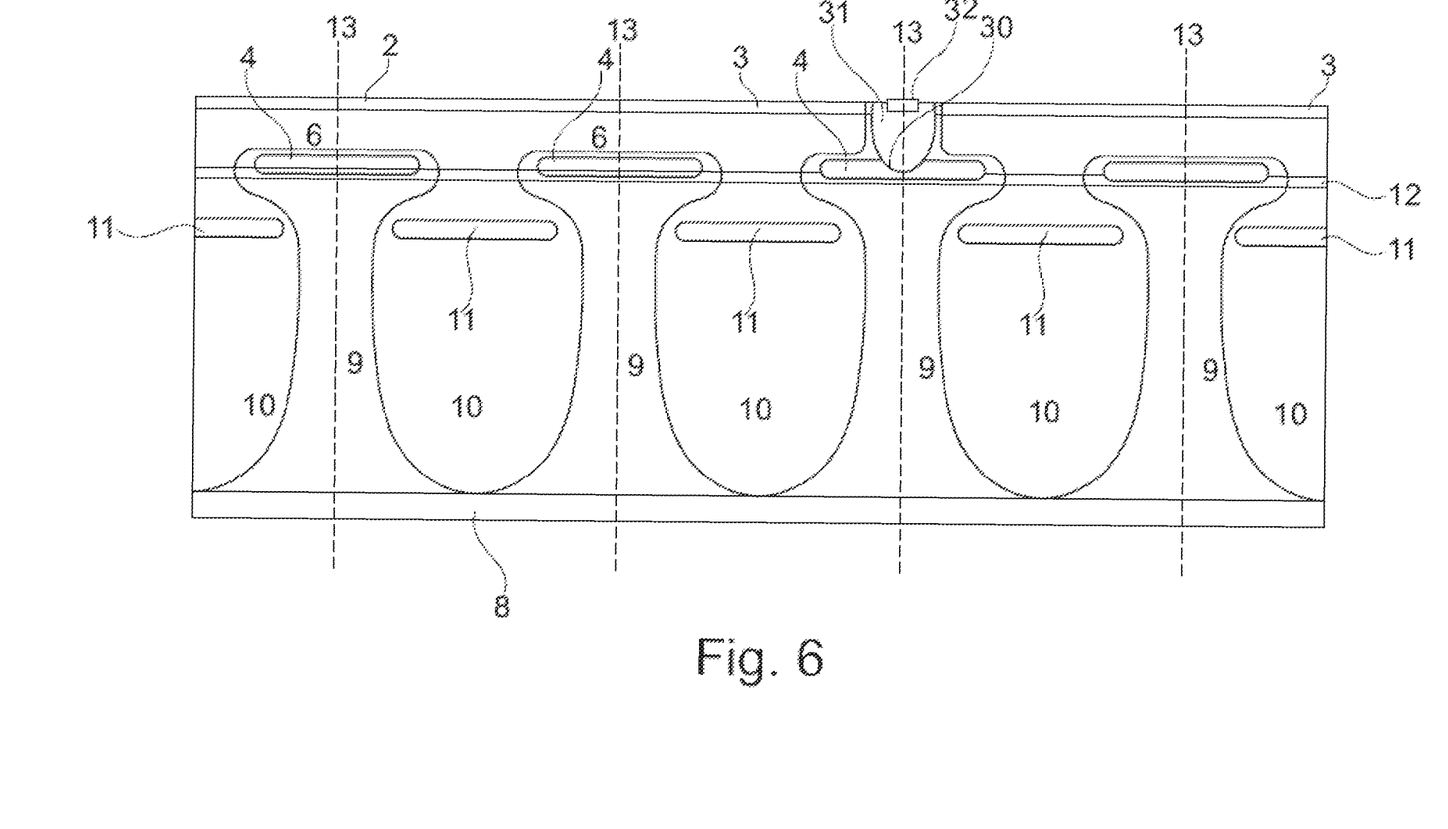

FIG. 6 shows a schematic view of a cross-section through a portion of a semiconductor photoconductor in which a further contact connection 30 is realised in the area of upper side 2 of substrate 1, and is in contact with lower doping zone 4 of a single pixel. Upper doping zone 3 is discontinuous in the proximity of further contact connection 30. Further contact connection 30 is created with a contact connection doping zone 31 and an external contact 32. The lateral separation between upper doping zone 3 and contact connection doping zone 31 is sufficient to prevent an avalanche breakdown between the two doping zones.

With a bias voltage at external contact 32 against the potential on substrate 1 at contacting layer 8, a current may now be measured by contact connection doping zone 31, lower doping zone 4, quench resistance area 9 and contacting layer 8 of a single pixel. In this case, the height of the substrate doping in quench resistance area 9 and the formation of the shape of this area due to the shift of the limits of impoverishment zones by means of the bias voltage at first additional doping zone 11 are most important in determining the magnitude of the quench resistance to be measured as a function of the selected doping conditions. The quench resistance areas 9 are more critical elements in determining the measurement value for quench resistance than all other regions through which the current flows.

Figure 7:
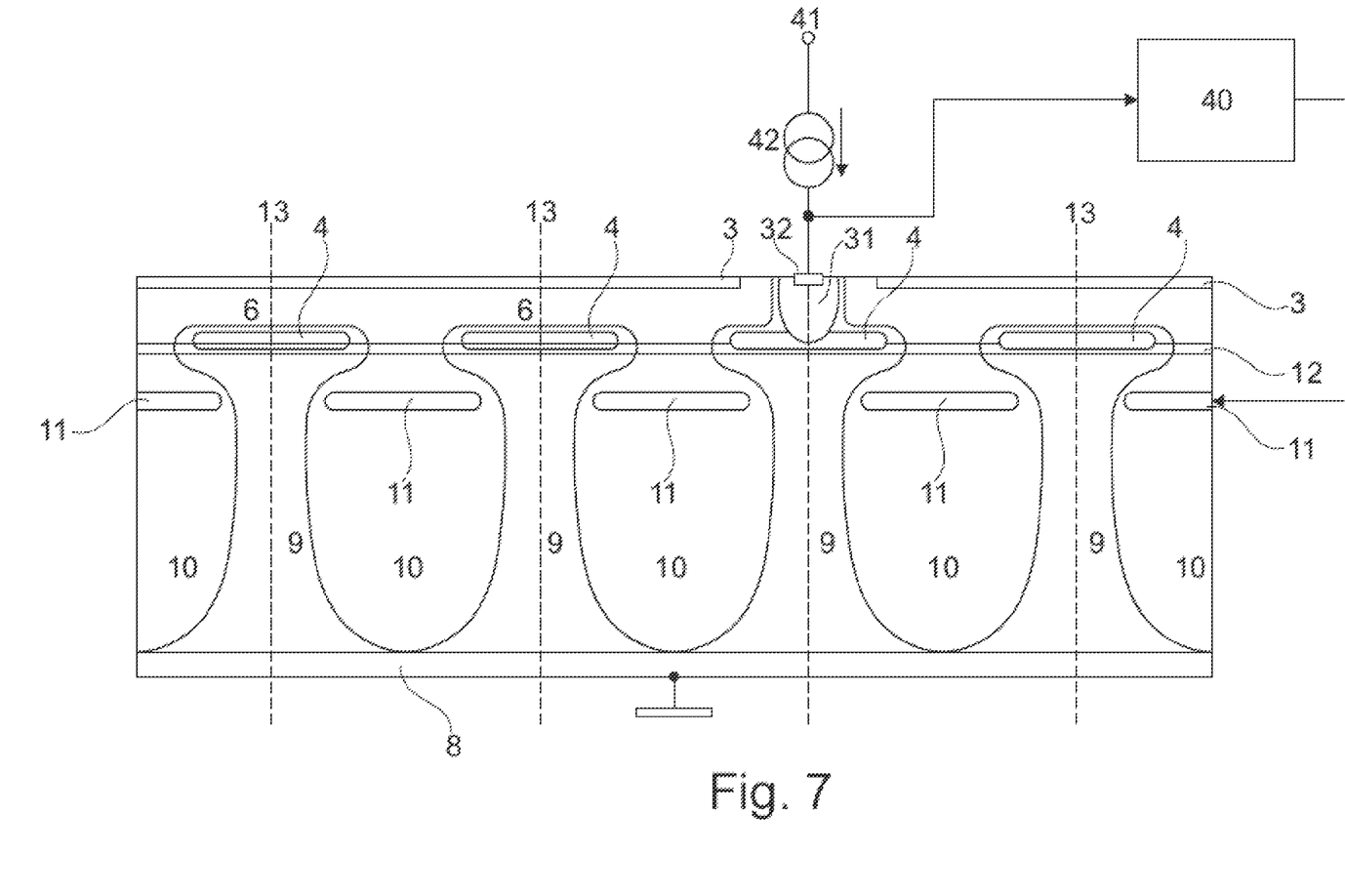

This may now be exploited as shown in FIG. 7 to couple a control circuit 40 between additional contact connection 30 and first additional doping zone 11 in a radiation detector system, which control circuit is particularly usable for stabilising the working point. Starting from a reference potential, a current is supplied to additional contact connection 30 from current source 42. A voltage difference now arises between additional contact connection 30 and the potential on the rear contacting layer 8 depending on the working point potential at first additional doping zones 11. This voltage difference is evaluated and converted to an assigned control signal for the potential at first additional doping zones 11 by control circuit 40. Alternatively, a design is possible as a bridge circuit, without a current source. For adjustment, control circuit 40 is always configured so that the quench resistance may be measured and on the basis of this a control signal for the potential may be made available at first additional doping zone 11.

Figure 8:
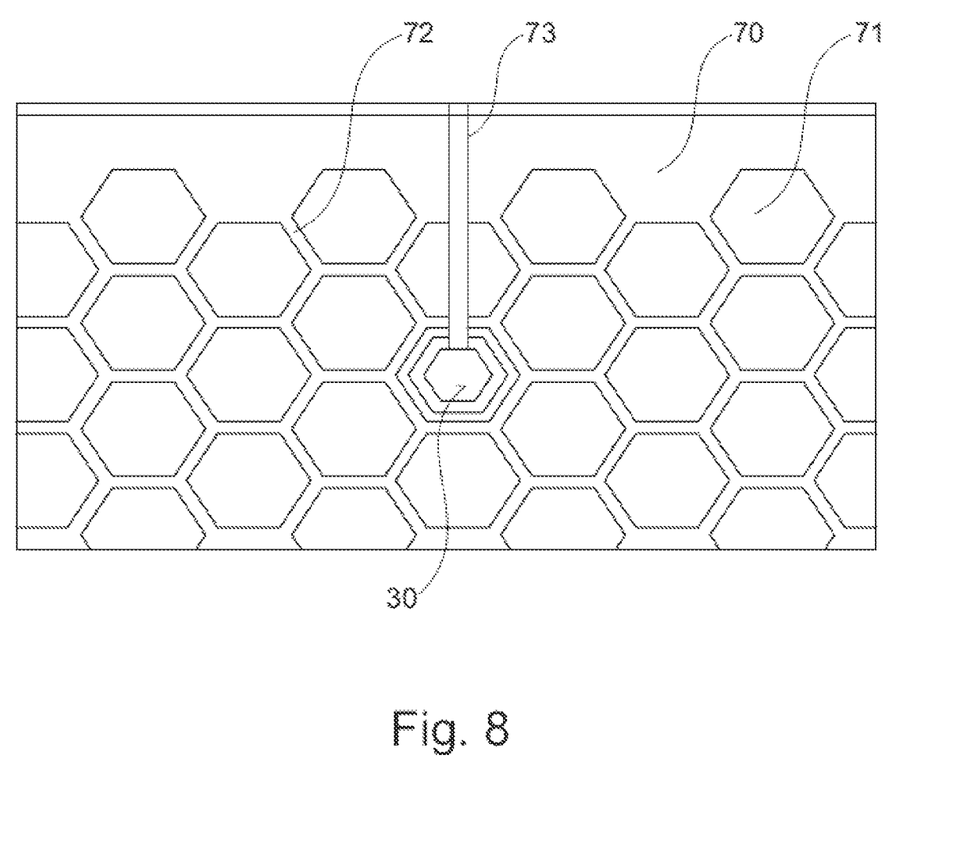

FIG. 8 is a schematic view of a detector array 70 for a semiconductor photodetector with individual pixel elements 71 and non-active areas 72 between these. Additional contact connector 30 is created in the area of detector array 70, and is connected towards the edge via a contacting element 73.

The features of the invention disclosed in the aforegoing description, the claims and the drawing may be pertinent either alone or in any combination for the realisation of the different variants of the invention.

The invention claimed is:

1. A semiconductor photodetector, comprising:
a semiconductor substrate,
an upper doping zone, which is doped according to a first doping type,
a lower doping zone, which is doped according to a second doping type,
a quench resistance area,
a contacting layer,
a first additional doping zone, which is doped according to the first doping type,
and
a second additional doping zone which is doped according to the second doping type,
wherein the upper doping zone extends laterally on a surface in the semiconductor substrate, wherein the lower doping zone and the upper doping zone are arranged to form avalanche areas in such manner that the lower doping zone extends laterally opposite the upper doping zone in the semiconductor substrate, wherein the lower doping zone is separated from an adjacent lower doping zone by an intermediate area, wherein the quench resistance area is arranged in the semiconductor substrate between the lower doping zone and the contacting layer, wherein the quench resistance area, when an operating voltage is applied, is formed as a region in the semiconductor substrate which is depleted of charge carriers and which is laterally restricted, wherein the contacting layer is arranged on the rear of the semiconductor substrate, wherein the first additional doping zone is arranged in the semiconductor substrate in the area between the lower doping zone and the contacting layer, extends laterally below the at least one intermediate area and into the area below the lower doping zone and the adjacent lower dopinge, and is discontinuous in the area below the lower doping zone, and wherein the second additional doping zone is arranged in the semiconductor substrate in the area between the lower doping zone and the first additional doping zone, extends laterally below the at least one intermediate area, and forms a potential barrier between the upper doping zone and the first additional doping zone, wherein, with reference to an upper side of the semiconductor substrate, the first additional doping zone is arranged deeper in the semiconductor substrate than the second additional doping zone.

2. The photodetector according to claim 1, wherein the second additional doping zone extends laterally at least over the entire width of the at least one intermediate area.

3. The photodetector according to claim 2, wherein the second additional doping zone is a continuous doping zone that is depleted of charge carriers in the at least one intermediate area.

4. The photodetector according to claim 1, further comprising a first contact connection in electrical contact with the first additional doping zone, via which a control circuit is connected to the first additional doping zone.

5. The photodetector according to claim 4, wherein the first contact connection has a first external contact and doping zones, wherein the doping zones overlap each other in a conductive manner and are doped according to the first doping type.

6. The photodetector according to claim 4, wherein the first contact connection is outside a detector array, which is formed from the avalanche areas and non-active areas between the avalanche areas.

7. The photodetector according to claim 1, further comprising a second contact connection in electrical contact with the lower doping zone, via which a control circuit is connected to the lower doping zone.

8. The photodetector according to claim 7, wherein the second contact connection has a second external contact and a doping zone that is doped according to the second doping type.

9. The photodetector according to claim 7, wherein the second contact connection is a discontinuous area of the upper doping zone within a detector array, which is formed from avalanche areas and non-active areas between the avalanche areas.

10. The photodetector according to claim 7, wherein the second contact connection is arranged centrally with respect to a quench resistance area, which is in electrical contact with the second contact connection.

11. A radiation detector system comprising:
a semiconductor photodetector according to claim 1, further comprising at least one first contact connection in electrical contact with the first additional doping zone, and
a control circuit that is coupled to and configured on the at least one contact connection so as to provide a control signal for a control potential to be applied to the first additional doping zone.

12. The radiation detector system according to claim 11, further comprising at least one second contact connection in electrical contact with the lower doping zone on the semiconductor photodetector, wherein the control circuit is coupled and still configured at the at least one second contact connection to capture a measurement value for the quench resistance of the semiconductor photodetector, and to provide a control signal derived therefrom for the control potential that is to be applied.

* * * * *

UNITED STATES PATENT AND TRADEMARK OFFICE
CERTIFICATE OF CORRECTION

| | |
|---|---|
| PATENT NO. | : 8,796,802 B2 |
| APPLICATION NO. | : 13/501939 |
| DATED | : August 5, 2014 |
| INVENTOR(S) | : Michael Pierschel et al. |

Page 1 of 1

It is certified that error appears in the above-identified patent and that said Letters Patent is hereby corrected as shown below:

In the Claims

At column 9, line 51, delete "dopinge" and insert -- doping zone --.

Signed and Sealed this
Twenty-fifth Day of November, 2014

Michelle K. Lee
*Deputy Director of the United States Patent and Trademark Office*